(12) United States Patent
Plants

(10) Patent No.: US 7,872,497 B2
(45) Date of Patent: Jan. 18, 2011

(54) FLEXIBLE CARRY SCHEME FOR FIELD PROGRAMMABLE GATE ARRAYS

(75) Inventor: William C. Plants, Campbell, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 12/645,863

(22) Filed: Dec. 23, 2009

(65) Prior Publication Data

US 2010/0100864 A1 Apr. 22, 2010

Related U.S. Application Data

(62) Division of application No. 11/962,922, filed on Dec. 21, 2007, now Pat. No. 7,663,400.

(51) Int. Cl.
*H03K 19/173* (2006.01)
*G06F 7/42* (2006.01)
*G06F 15/00* (2006.01)

(52) U.S. Cl. .................... 326/38; 326/41; 326/53; 708/505; 708/670

(58) Field of Classification Search ............ 326/38–41, 326/53; 708/505, 670
See application file for complete search history.

(56) References Cited

U.S. PATENT DOCUMENTS

| | | | |
|---|---|---|---|
| 3,728,532 A | 4/1973 | Pryor | |
| 5,349,250 A | 9/1994 | New | |
| 5,481,206 A | 1/1996 | New et al. | |
| 5,724,276 A | 3/1998 | Rose et al. | |
| 5,818,255 A | 10/1998 | New et al. | |
| 5,898,319 A | 4/1999 | New | |
| 6,108,191 A | 8/2000 | Bruchhaus et al. | |
| 6,140,839 A | 10/2000 | Kaviani et al. | |
| 6,154,053 A | 11/2000 | New | |
| 6,157,209 A | 12/2000 | McGettigan | |
| 6,288,570 B1 | 9/2001 | New | |
| 6,708,191 B2 | 3/2004 | Chapman et al. | |
| 6,836,147 B2 | 12/2004 | Nakaya | |
| 6,873,181 B1 | 3/2005 | Pedersen | |

(Continued)

OTHER PUBLICATIONS

Cyclone Architecture, Cyclone Device Handbook, vol. 1, C51002-1. 5, [Internet] http://www.altera.com/literature/hb/cyc/cyc_c51002. pdf, Altera Corp., Jan. 2007, pp. 2-1, 2-10, Fig. 2-7, San Jose, CA, USA.

(Continued)

*Primary Examiner*—Vibol Tan
(74) *Attorney, Agent, or Firm*—Lewis and Roca LLP

(57) ABSTRACT

A fast, flexible carry scheme for use in clustered field programmable gate array architectures is described. Each cluster has a cluster carry input node, a cluster carry output node, a cluster carry output circuit having an output coupled to the cluster carry output node, a first input coupled to the cluster carry input node, and a second input and a plurality of logic modules each comprising a logic function generator circuit coupled to a carry circuit. The logic modules are coupled in a series carry arrangement between the cluster carry input node and the second input of the cluster carry output circuit such that the least significant bit of an arithmetic logic circuit can be programmably placed in any of the logic modules.

8 Claims, 13 Drawing Sheets

U.S. PATENT DOCUMENTS

| | | | |
|---|---|---|---|
| 7,016,932 | B2 | 3/2006 | Kantabutra et al. |
| 7,129,748 | B1 | 10/2006 | McCollum et al. |
| 7,185,035 | B1 | 2/2007 | Lewis et al. |
| 7,218,139 | B1 | 5/2007 | Young et al. |
| 7,573,294 | B2 * | 8/2009 | Madurawe et al. ............ 326/38 |
| 7,656,190 | B2 * | 2/2010 | Dorairaj et al. ............... 326/38 |
| 7,663,400 | B1 | 2/2010 | Plants |
| 7,685,215 | B1 * | 3/2010 | Gaide et al. ................. 708/235 |
| 7,746,112 | B1 * | 6/2010 | Gaide et al. .................... 326/41 |
| 7,772,879 | B1 | 8/2010 | Feng et al. |
| 2003/0001613 | A1 | 1/2003 | Nakaya |
| 2009/0243652 | A1 | 10/2009 | Dorairaj et al. |

OTHER PUBLICATIONS

Cyclone II Architecture, Cyclone II Device Handbook, vol. 1, CII51002-3.1, [Internet] http://www.altera.com//literature/hb/cyc2/cyc2_cii51002.pdf, Altera Corp., Feb. 2007, p. 2-1, p. 2-6, Fig. 2-4, San Jose, CA, USA.

Stratix Architecture, S51002-3.2, Stratix Device Handbook, vol. 1, [Internet] http://www.altera.com/literature/hb/stx/ch_2_vol_1.pdf, Altera Corp., Jul. 2005, p. 2-1, p. 2-11, Fig. 2-7, San Jose, CA, USA.

Stratix II Architecture, SII51002-4.3, [Internet] http://www.altera.com/literature/hb/stx2/stx2_sii51002.pdf,, Altera Corp, May 2007, pp. 2-1, 2-14 to 2-19, Figs. 2-10, 2-11, 2-12, 2-13, 2-14, San Jose, CA, USA.

Fib, David et al., "Technology Mapping for a Two-Output RAM-Based Field Programmable Gate Array," European Design Automation Conf. (EDAC) 1991, p. 534-538, IEEE Computer Society Press, Los Alamitos, CA, USA.

Ling, Huey, "High-Speed Binary Adder," IBM J. Res. Develop., vol. 25, No. 3, May 1981, pp. 156-166.

Virtex -E 1.8 V Extended Memory Field Programmable Gate Arrays, DS025-2 (V2.2), Module 2 of 4, [Internet] http://www.xilinx.com/support/documentation/data_sheets/ds025-2.pdf, Xilinx, Inc., Sep. 10, 2002, pp. 1 & p. 4, Figs. 4&5, San Jose, CA, USA.

Virtex-II Platform FPGAs: Complete Data Sheet, DS031 (v3.5), Module 2 of 4, [Internet] http://www.xilinx.com/support/documentation/data_sheets/ds031.pdf, Xilinx, Inc., Nov. 5, 2007, pp. 1 & 13, Fig. 16, San Jose, CA, USA.

Virtex-4 FPGA User Guide, UG070 (v2.4), [Internet] http://www.xilinx.com/support/documentation/user_guides/ug070.pdf, Xilinx, Inc., Apr. 10, 2008, Cover page, p. 185, Fig. 5-2, San Jose, CA, USA.

Virtex-5 FPGA User Guide, UG190 (v4.1), http://www.xilinx.com/support/documentation/user_guides/ug070.pdf, Xilinx, Inc., Apr. 25, 2008, pp. Cover, 173, Fig. 5-3, San Jose, CA, USA.

Actel Axcelerator Family FPGAs, Detailed Specifications (v2.6) http://www.actel.comldocuments/AXDetailedSpecs_DS.pdf, pp. 2-43 through 2-46, Mountain View, CA, USA.

Altera Cyclone III Device Handbook, vol. 1: http://www.altera.com/literature/hb/cyc3/cyc3_ciii51002.pdf, pp. 2-1, 2-2, 2-4, 2-5 & 2-6, San Jose, CA, USA.

Altera Stratix III Device Handbook, vol. 1: http://www.altera.com/literature/hb/cyc3/cyc3_ciii51002.pdf, pp. 2-1, 2-13 to 2-19, San Jose, CA, USA.

Lattice LatticeSC/M Family Data Sheet, DS1004 Version 01.8, Lattice Semiconductor Corp., http://www.latticesemi.com/documents/DS1004.pdf, Nov. 2007, pp. 2-1, 2-3 to 2-6, Hillsboro, OR, USA.

Xilinx Virtex-5 User Guide, UG190 (v3.1) Sep. 11, 2007, http://www.xilinx.com/support/documentation/user_guides/ug190.pdf, pp. Cover, 168-170, San Jose, CA, USA.

Virtex 2.5 V Field Programmable Gate Arrays, Xilinx Data Book 1999, Xilinix® Corporation, Feb. 16, 1999 (Version 1.3), pp. 3-8 & 3-9, San Jose, CA, USA.

Spartan and SpartanXL Families Field Programmable Gate Arrays, Xilinx Data Book 1999, Xilinx® Corporation, Jan. 6, 1999 (Version 1.4), pp. 4-18, 4-19, & 4-20, San Jose, CA, USA.

Office Action mailed Oct. 27, 2010 in co-pending U.S. Appl. No. 12/823,266 filed entitled Logic Module Including Versatile Adder for FPGA.

Logic Elements and Logic Array Blocks in Cyclone III Devices, CS XXXXXXX, [Internet] http://www.altera.com/literature/hb/cyc3/cyc3_ciii51002.pdf, Altera Corp, X pages, Jul. 2007, San Jose, CA, USA (Fig. 2-5, p. 2-5).

Logic Array Blocks and Adaptive Logic Modules in Stratix III Devices, http://www.altera.com/literature/hb/stx3/stx3_siii51002.pdf, x pages, San Jose, CA, USA. (Figs. 2-11, 2-12, 2-13, 2-14, pp. 2-14 to 2-19), May 2009.

* cited by examiner

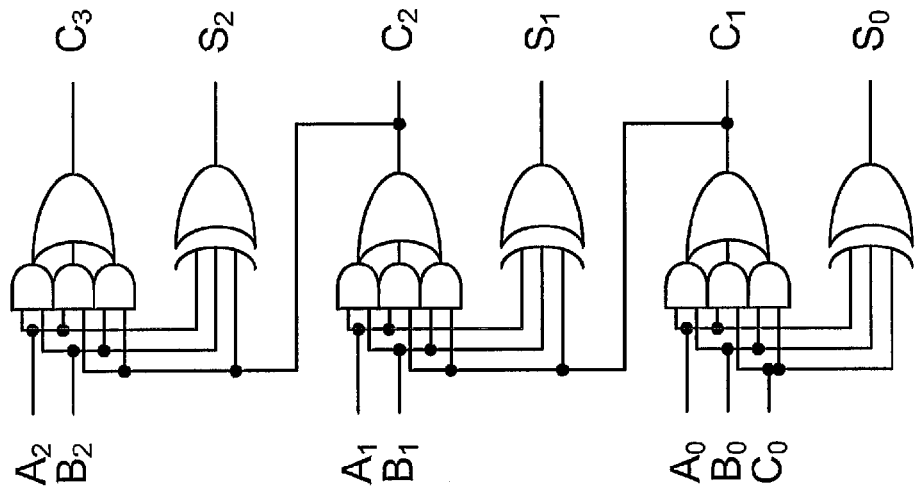
FIGURE 2C (Prior Art)
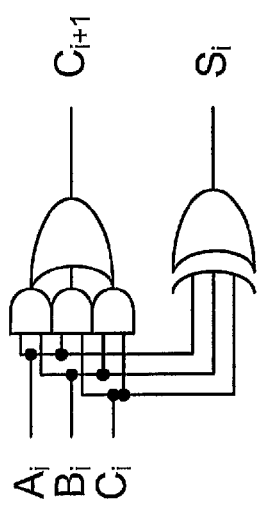
FIGURE 2A (Prior Art)
FIGURE 2B (Prior Art)

| Ai | Bi | Gi | Pi |
|----|----|----|----|
| 0 | 0 | 0 | 0 |
| 1 | 0 | 0 | 1 |
| 0 | 1 | 0 | 1 |
| 1 | 1 | 1 | 0 |

FLEXIBLE CARRY SCHEME FOR FIELD PROGRAMMABLE GATE ARRAYS

CROSS-REFERENCE TO RELATED APPLICATIONS

This application is a divisional of co-pending U.S. patent application Ser. No. 11/962,922, filed Dec. 21, 2007, the entirety of which is incorporated by reference herein.

BACKGROUND OF THE INVENTION

1. Field of the Invention

The invention pertains to the field of integrated circuits. More particularly, the invention pertains to field programmable gate array integrated circuit devices.

2. Description of Related Art

Field Programmable Gate Array (FPGA) integrated circuit devices are known in the art. An FPGA comprises any number of initially uncommitted logic modules arranged in an array along with an appropriate amount of initially uncommitted routing resources. Logic modules are circuits which can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as wires, switches, multiplexers, and buffers. Logic modules, routing resources, and other features like, for example, I/O buffers and memory blocks, are the programmable elements of the FPGA.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and must be appropriate for the type of control element used.

Typically a user creates a logic design inside manufacturer-supplied design software. The design software then takes the completed design and converts it into the appropriate mix of configured logic modules and other programmable elements, maps them into physical locations inside the FPGA, configures the interconnect to route the signals from one logic module to another, and generates the data structure necessary to assign values to the various control elements inside the FPGA.

Many FPGA architectures employing various different logic modules and interconnect arrangements are known in the art. Some architectures are flat while others are clustered. In a flat architecture, the logic modules may or may not be grouped together with other logic modules, but all of the logic modules have free access to the larger routing architecture.

In a clustered architecture, the logic modules are grouped together into clusters which typically have a two level hierarchy of routing resources associated with them. The first level typically makes interconnections internal to the cluster while the second level typically allows interconnections between clusters. FIG. 1 illustrates a block diagram of a prior art logic cluster which illustrates the basic principles of a clustered architecture. The logic cluster contains four logic modules each comprising a logic function generator circuit of a type sometimes called a look-up table (or LUT) each having four inputs which are designated LUT4 in the diagram. Each LUT4 has an associated flip/flop designated FF. The output of each LUT4 is coupled to the data input of the associated flip/flop. The output of each LUT4 and each flip/flop is coupled to the block designated Cluster Internal Routing Lines which is the first level of the routing hierarchy. The output of each LUT4 and each flip/flop is also coupled to the block designated External Horizontal & Vertical Routing Lines which is the second level of the routing hierarchy.

In the architecture of FIG. 1, signals are transmitted from the second level of the architecture to the first level by means of the ten Cluster Input Multiplexers coupled between the External Horizontal & Vertical Routing Lines and the Cluster Internal Routing Lines. Various lines and resources from other parts of the FPGA are connected to the inputs of the Cluster Input Multiplexers by means of the External Horizontal & Vertical Routing Lines. The lines internal to the Cluster Internal Routing Lines block come from a variety of sources: the outputs of the Cluster Input Multiplexers, the outputs of the cluster's LUT4s and flip/flops, and possibly other sources such as clock networks and other special functions not shown in FIG. 1 to avoid overcomplicating the diagram.

The LUT4 Input Multiplexers in FIG. 1 are coupled between the Cluster Internal Routing Lines block and the various inputs on the LUT4 blocks. Since there are four LUT4 blocks each with four inputs, there are a total of sixteen LUT4 Input Multiplexers in the cluster. In general, the number of inputs to each LUT4 Input Multiplexer is less than the total number of lines in the Cluster Internal Routing Lines block, so each LUT4 Input Multiplexer can only transmit a subset of those signals to its associated LUT4 input.

Note that in FIG. 1 there are only ten Cluster Input Multiplexers while there are sixteen LUT4 inputs. This places certain restrictions on the place and route software tool (or tools), since in the case of FIG. 1 no sub-circuit with more than ten logic inputs can be placed in a single cluster. This restriction is the defining difference between flat and clustered FPGA architectures. FPGA designers who accept this restriction, believe that the overall area required by the Cluster Input Multiplexers and the LUT4 Input Multiplexers is less than the area that would be required to only have LUT4 Input Multiplexers and eliminating the first level of routing hierarchy. In a clustered architecture, the less numerous Cluster Input Multiplexers tend to have a large number inputs while the more numerous LUT4 Input Multiplexers have fewer inputs. In a non-clustered architecture, the LUT4 Input Multiplexers would have to many more inputs to achieve the equivalent routing capability.

The determination of whether to build an FPGA in a clustered or non-clustered architecture depends on a great many factors like the cost of various silicon features, the programmable technology being employed, the familiarity of the designers with one approach or the other, and various issues related to the design software, and is beyond the scope of this disclosure. However both architectural approaches can be found in commercial FPGAs.

One area where FPGA manufacturers typically attempt to enhance their products is in the area of computer arithmetic. This typically takes the form of adding some sort of carry circuit coupled to the logic function generator in each logic module which accepts a carry input from an adjacent logic module and propagates a carry output to a different adjacent logic module, typically on the other side so that carry chains can propagate along a row or column of the FPGA array. Efforts are generally directed towards doing ordinary addition quickly and efficiently, since other operations such as subtraction, multiplication, and magnitude comparison can be efficiently performed by judicious use of adders.

FIG. 2A shows the logic for a full adder circuit known in the art. FIG. 2B shows the logic truth table for the full adder while FIG. 2C shows the full adder circuit used to implement a three-bit ripple adder known in the art. The full adder circuit has two operand inputs represented by $A_i$ and $B_i$ in the diagram and a carry input from the previous stage that is designated as $C_i$. The full adder circuit has a sum output designated as $S_i$ and a carry output designated $C_{i+1}$. The subscript "i" is an integer variable which represents which bit position in a binary number the full adder cell is associated with in any given adder. Traditionally i=0 for the stage associated with the least significant bit of the adder. Each of the three inputs can have a binary value of either 0 or 1. Thus if one were to add all three bits together, one could get a decimal value of either 0, 1, 2, or 3 which would be represented as 00, 01, 10, and 11 respectively in two binary bits. The $C_{i+1}$ output represents the most significant bit of the sum and the $S_i$ output represents the least significant bit.

In the ripple adder of FIG. 2C, the full adders of the type shown in FIG. 2A are shown in a series carry arrangement. This means that depending on the operands $A_2$-$A_0$ and $B_2$-$B_0$, it is possible for a carry input signal to enter via $C_0$, the carry input to the least significant bit of the adder, and propagate through the adder cells until reaching $C_3$, the carry output of the most significant bit of the adder. For every stage (or bit position) the $C_{i+1}$ output becomes the $C_i$ input of the next stage. For example, the carry output of the middle stage (called stage 1 because i=1 for all of the inputs) is designated $C_2$ (where i+1=2) and becomes the $C_i$ input of stage 2 (where i=2). This is analogous to humans doing decimal arithmetic. When two decimal digits are added together the result is between 0 and 19 if there is a carry in from the previous digit (because 9+9+1=19, which is the maximum value for a digit). If the sum for that digit is between 0 and 9 that is the value for that digit and the addition operation continues to the next significant digit; if the answer is between 10 and 19, the value for the current digit is the least significant digit of the sum and a 1 is carried (i.e., added) to the next digit (which has a value 10 times bigger than the current digit, so only a 1 and not a 10 is carried). In the full adder circuit, the $C_{i+1}$ signal represents a value of "2" in the stage where it is generated but only represents a "1" in the next stage because bit in that stage has a binary weight of twice the previous stage.

The ripple carry adder of FIG. 2C is often the least expensive in terms of silicon area to implement in hardware, but it has the disadvantage of being slow when wide numbers with lots of bits are being added because the speed limiter is the time it takes for the carry signal to propagate from the least significant bit to the most significant bit. This has prompted computer designers to look for alternative approaches which can add numbers faster than a ripple adder of the same width can.

One such attempt is the carry-select adder shown in FIG. 3A, which is known in the art. The technique involves doing the addition twice for each section of the adder: once assuming that the carry in equals 0 and once assuming the carry in equals 1. The carry input signal then goes to the select input of a multiplexer which selects the correct sum and carry outputs from the correct adder and presents them to the adder outputs. While this approach is slower for a single stage like that shown in FIG. 3A, a multistage adder constructed this way like the one shown in FIG. 3B with the $C_3$ output of one stage coupled to the $C_0$ input of the next greatly enhances performance because the worst case delay of each additional stage bypasses the adders and only involves the delay from the multiplexer select input to its output. In FIG. 3B only the carry multiplexers are shown to illustrate the critical path passes from $C_4$ to $C_8$ to $C_{12}$ and $C_{16}$ which completely bypasses the adders in all of the high order stages. The cost of this approach is an adder that takes roughly twice the area to implement since twice as many adder bits are required.

Another attempt known in the art is the carry-look-ahead adder shown in FIGS. 4A, 4B and 4C. The basic adder cell is shown in FIG. 4A and the truth table is shown in FIG. 4B. Its key feature is that it has no carry in signal, no carry out signal, and no sum out signal. Instead, they have been replaced with two outputs $G_i$ and $P_i$. The $G_i$ signal is known as the carry-generate signal. It has a value of logic one if a carry out equal to logic one will occur in a full adder like the one shown in FIG. 2A as a result solely of $A_i$ and $B_i$. This can only occur if both $A_i$ and $B_i$ equal logic one, since this will result in a sum of either 2 or 3 depending on the carry input. Thus logic equation for the carry-generate signal is $G_i = A_i$ AND $B_i$.

The $P_i$ signal is known as the carry-propagate signal. It has a value of logic one if the carry signal would propagate from $C_i$ to $C_{i+1}$ in a full adder like the one shown in FIG. 2A. This can only occur when one and only one of $A_i$ or $B_i$ equals logic one. Thus the logic equation for the carry-propagate signal is $P_i = A_i$ XOR $B_i$.

Shown in FIG. 4C is a complete three-bit carry look-ahead adder. On the left are the basic cells for each bit and on the right is the necessary logic to implement the adder based upon the outputs of the basic cells. For each bit position, the equation for the sum output $S_i$ is $S_i = P_i$ XOR $C_i = (A_i$ XOR $B_i)$ XOR $C_i$, which is equivalent to the full adder logic in FIG. 2A.

The key feature for the carry logic is that the carry input $C_i$ is generated for all stages simultaneously as a logical function of all the $G_i$ signals, all the $P_i$ signals, and the first stage carry input $C_0$. Thus for very wide adders, the carry for each stage will propagate with the same number of gate delays for all bit positions making for a very fast adder at the cost of significant amount of logic.

The carry out signal for the first stage $C_1$ will equal logic one if either a carry is generated in the first stage (e.g., $G_0=1$) or if a carry is propagated from $C_0$ through the first stage to $C_1$ (e.g., $P_0$ AND $C_0=1$). Thus the logic equation is $C_1 = G_0$ OR ($P_0$ AND $C_0$). The second stage is more complicated because there are more cases. The carry out signal for the second stage $C_2$ will equal logic one if a carry is generated in the second stage, if a carry is generated in the first stage and propagated through the second stage, or if a carry is propagated from $C_0$ through the first and second stages to $C_2$. Thus the logic equation is $C_2 = G_1$ OR ($G_0$ AND $P_1$) OR ($C_0$ AND $P_0$ AND $P_1$). A similar line of reasoning applies to the carry output of the third stage in FIG. 4C and all subsequent stages in wider carry look-ahead adders.

Shown in FIG. 5 is a three bit carry-skip adder known in the art. This approach shares elements of the ripple adder of FIGS. 2A, 2B and 2C, the carry-select adder of FIGS. 3A and 3B, and the carry look-ahead adder of FIGS. 4A, 4B and 4C. Internal to the adder, the carry for individual bit positions is generated like a ripple adder for economy, a carry-propagate signal is generated for each stage, and the logical AND of all the carry-propagate bits is used to select between the carry input signal to the adder and the output of the internal ripple carry chain. Like the carry-select adder, when multiple stages are placed in a series carry arrangement, the delay of the second and subsequent stages is only the multiplexer delay since the internal adder logic is bypassed.

Because the carry skip adder inherently has a nice balance of economy and performance, variations of it have been used in a number of FPGA architectures, both flat and clustered. In clustered architectures, there has always been a historic limitation on the placement of adders in the clusters. Typically the cluster contains at most two carry-skip stages, and the least significant bit of an adder is restricted to being placed in the module where the carry input first enters the carry-skip stage. Like any irregularity in an FPGA architecture, giving some logic modules unique functionality relative to other logic modules creates a non-homogeneity that substantially complicates the implementation of the design software, particularly the place and route tool (or tools). The goal of the present invention is to eliminate the non-homogeneity issues associated with the use of adders in clustered FPGA architectures of the prior art.

BRIEF DESCRIPTION OF THE DRAWINGS

FIG. 2A shows a full adder circuit of the prior art.
FIG. 2B shows the Boolean truth table for the full adder circuit of FIG. 2A.
FIG. 2C shows a three-bit ripple adder of the prior art.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
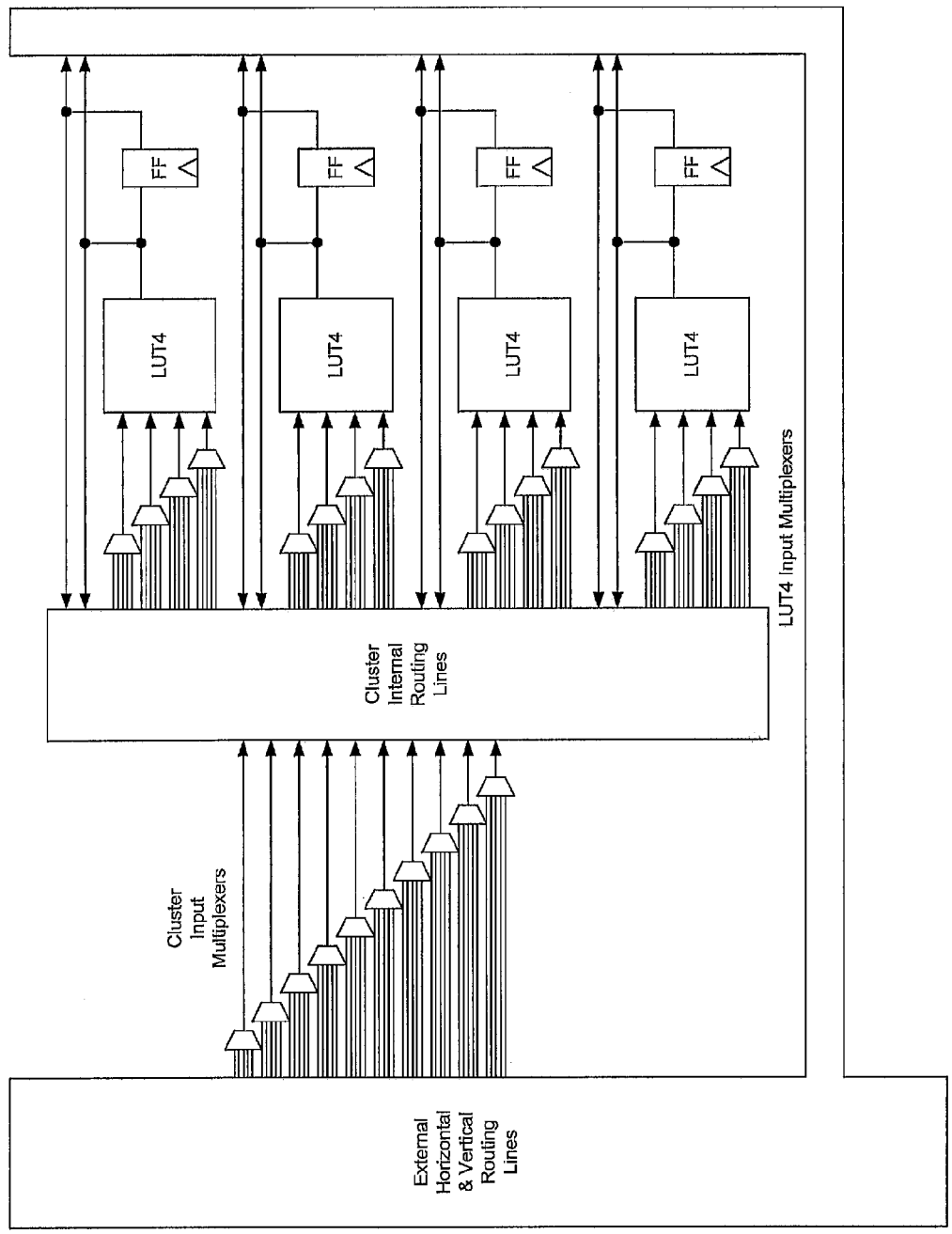
FIG. 1 shows a clustered FPGA architecture of the prior art.
Figure 3A:
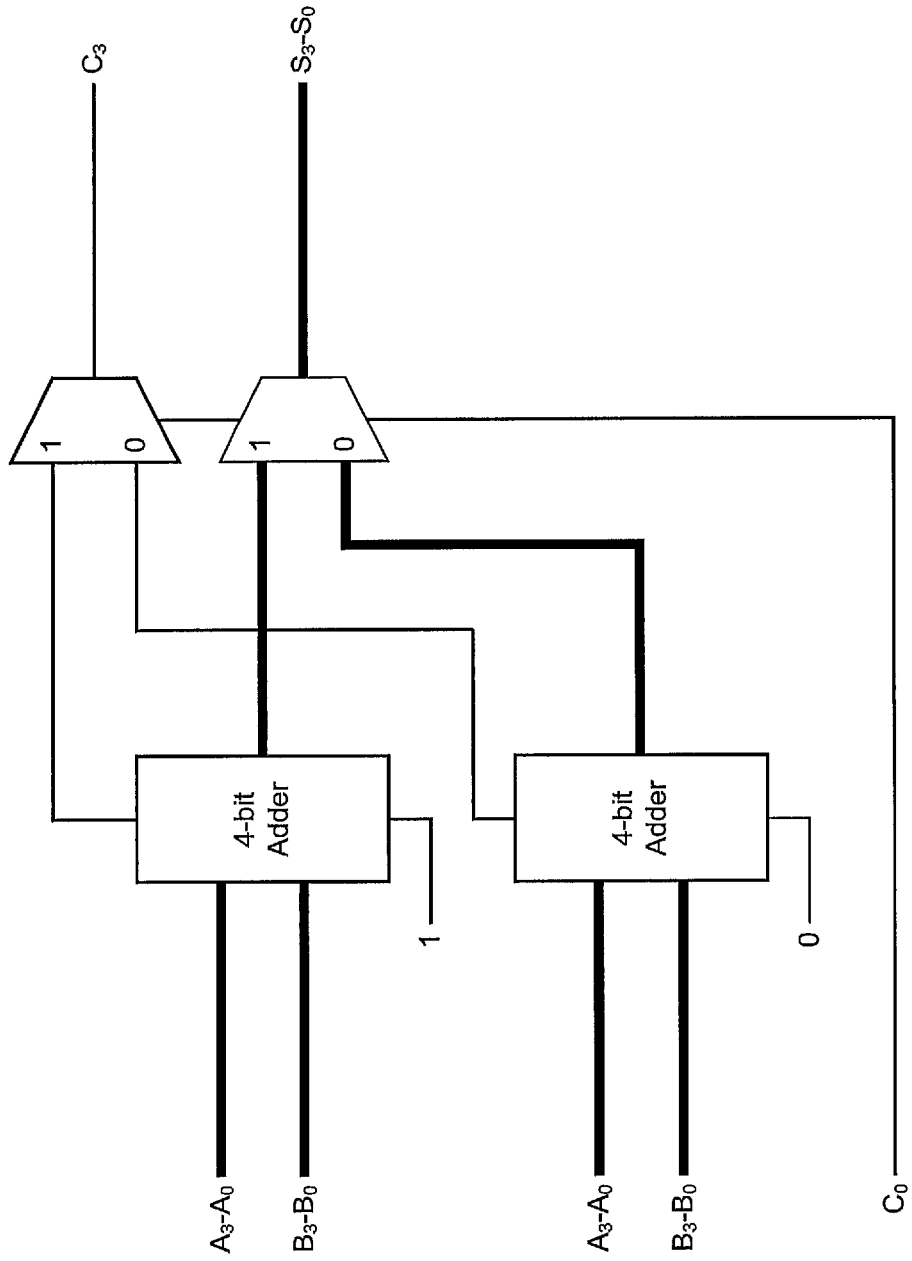
FIG. 3A shows a four-bit carry-select adder of the prior art
Figure 3B:
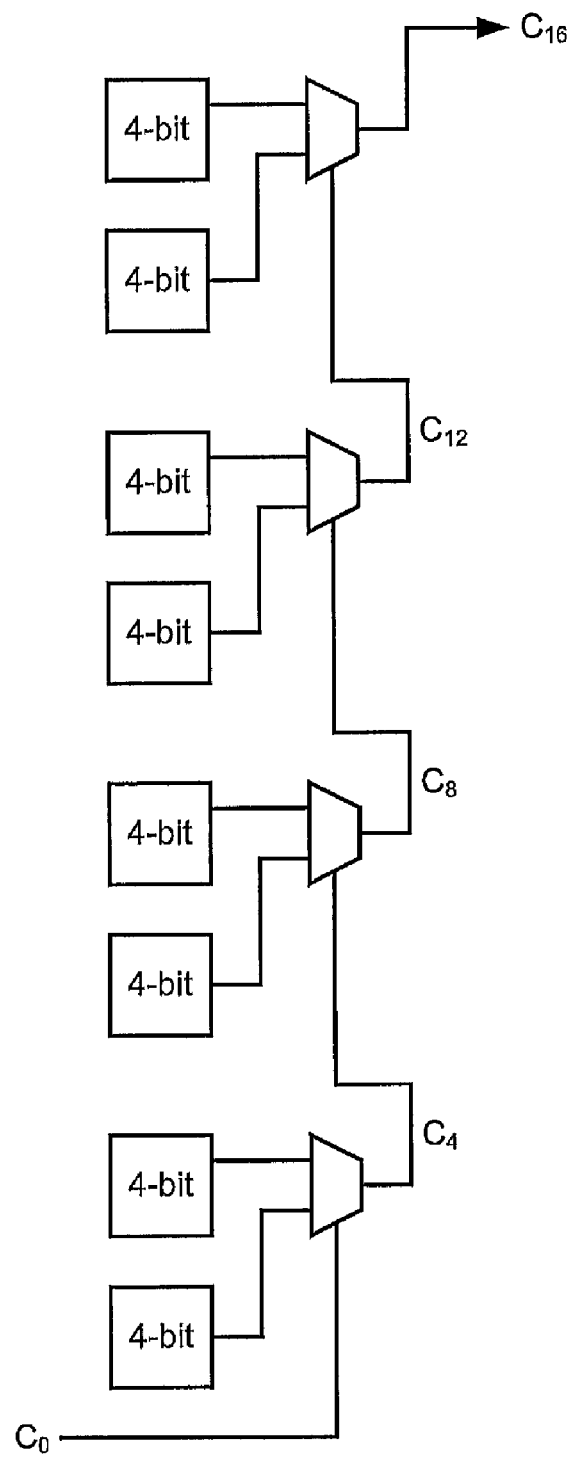
FIG. 3B shows a sixteen-bit carry-select adder of the prior art
Figure 6A:
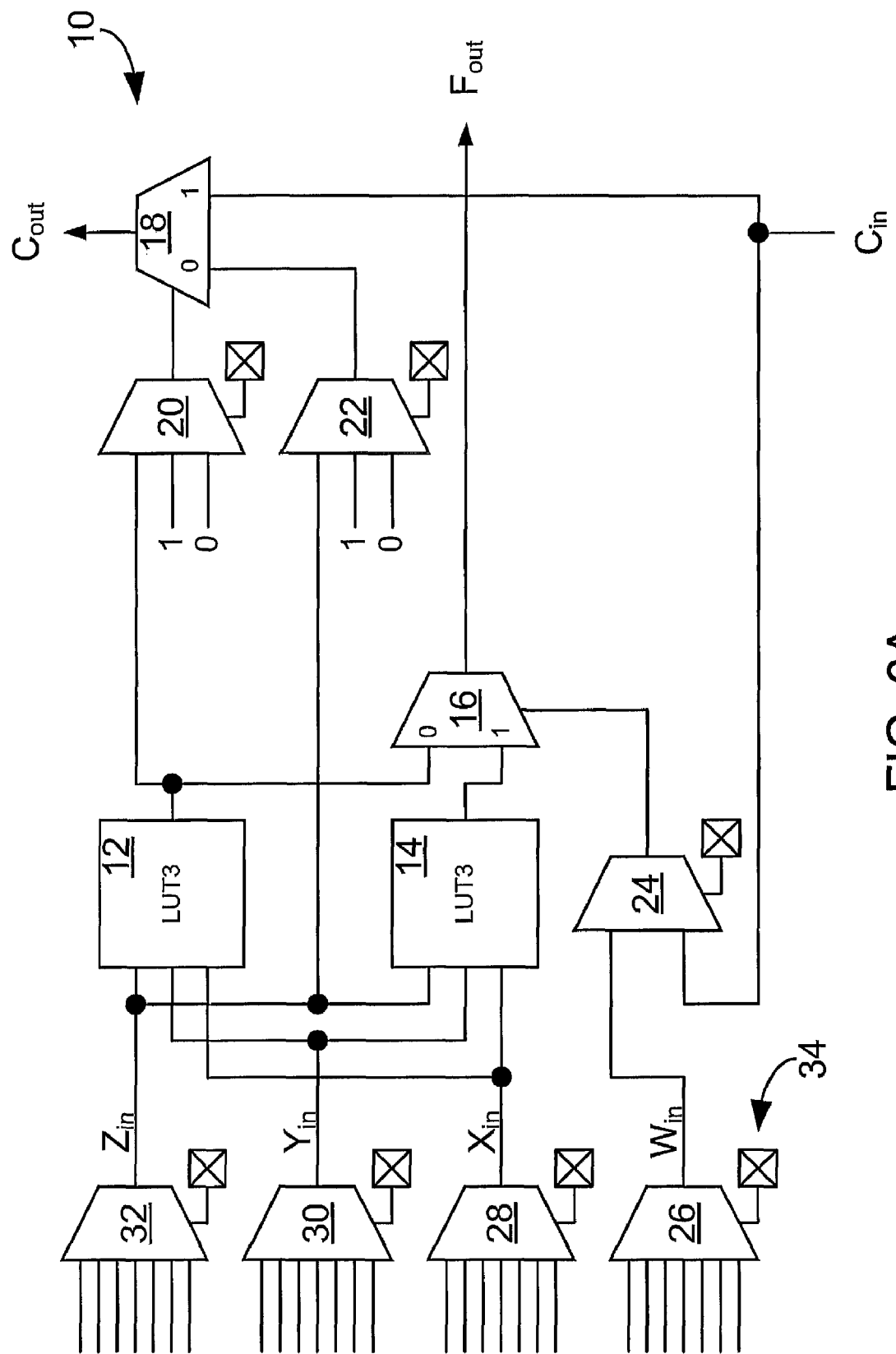
FIG. 6A shows an illustrative logic module employing the principles of the present invention.

Turning to FIG. 6A a logic module indicated generally by reference number 10 is shown. Logic module 10 comprises a logic function generator circuit and a carry circuit coupled to one another. The function generator circuit comprises LUT3 block 12, LUT3 block 14, multiplexer 16, input nodes $W_{in}$, $X_{in}$, $Y_{in}$, $Z_{in}$, and output node $F_{out}$. The carry circuit comprises multiplexers 18, 20 and 22, input node $C_{in}$, and output node $C_{out}$. The function generator and the carry circuit share multiplexer 24. Also shown in FIG. 6A are LUT4 input multiplexers 26, 28, 30, and 32 which are analogous to the LUT4 input multiplexers shown in FIG. 1. The function generator circuit is capable of generating any logic function of four binary variables (like the LUT4 function generator circuits of FIG. 1): $F_{out}=f(W_{in}, X_{in}, Y_{in}, Z_{in})$. Those skilled in the art will realize that many other function generators are known in the art, that other function generators could be used, albeit with carry logic having a slightly different logic function, and the choice of this particular illustrative function generator is in no way limiting.

Some of the multiplexers in FIG. 6A, specifically multiplexers 16 and 18 are dynamic, while the rest are static. Dynamic multiplexers have the selected multiplexer data input that is gated to the multiplexer output change during normal operation due to changes in the logic value on the multiplexer select input. Static multiplexers have the selected multiplexer data input that is gated to the output determined by the information programmed into the control elements controlling the multiplexer and this value does not change during normal operation. Static multiplexers are identified by a square with diagonally crossed lines connected to multiplexer select input(s), an exemplary one of which is shown at reference number 34. Persons skilled in the art will realize that this is a symbolic representation of the static multiplexers present, and that there are many different ways to implement them depending on the type of control element used in the FPGA and that all multiplexer implementations are within the scope of the inventive principles of the present invention.

During logic mode, the carry circuit is not used. Multiplexer 24 is set so that the output of LUT4 input multiplexer 26 is gated to the select input of multiplexer 16. LUT3 block 12 is programmed to generate the appropriate three input binary function $f_0(X_{in}, Y_{in}, Z_{in})$ for when $W_{in}=0$, Similarly, LUT3 block 14 is programmed to the appropriate three input binary function $f_1(X_{in}, Y_{in}, Z_{in})$ for when $W_{in}=1$. In this manner, LUT3 block 12, LUT3 block 14, and multiplexer 16 implement the correct four input binary function $F_{out}=f(W_{in}, X_{in}, Y_{in}, Z_{in})$.

Figure 6B:
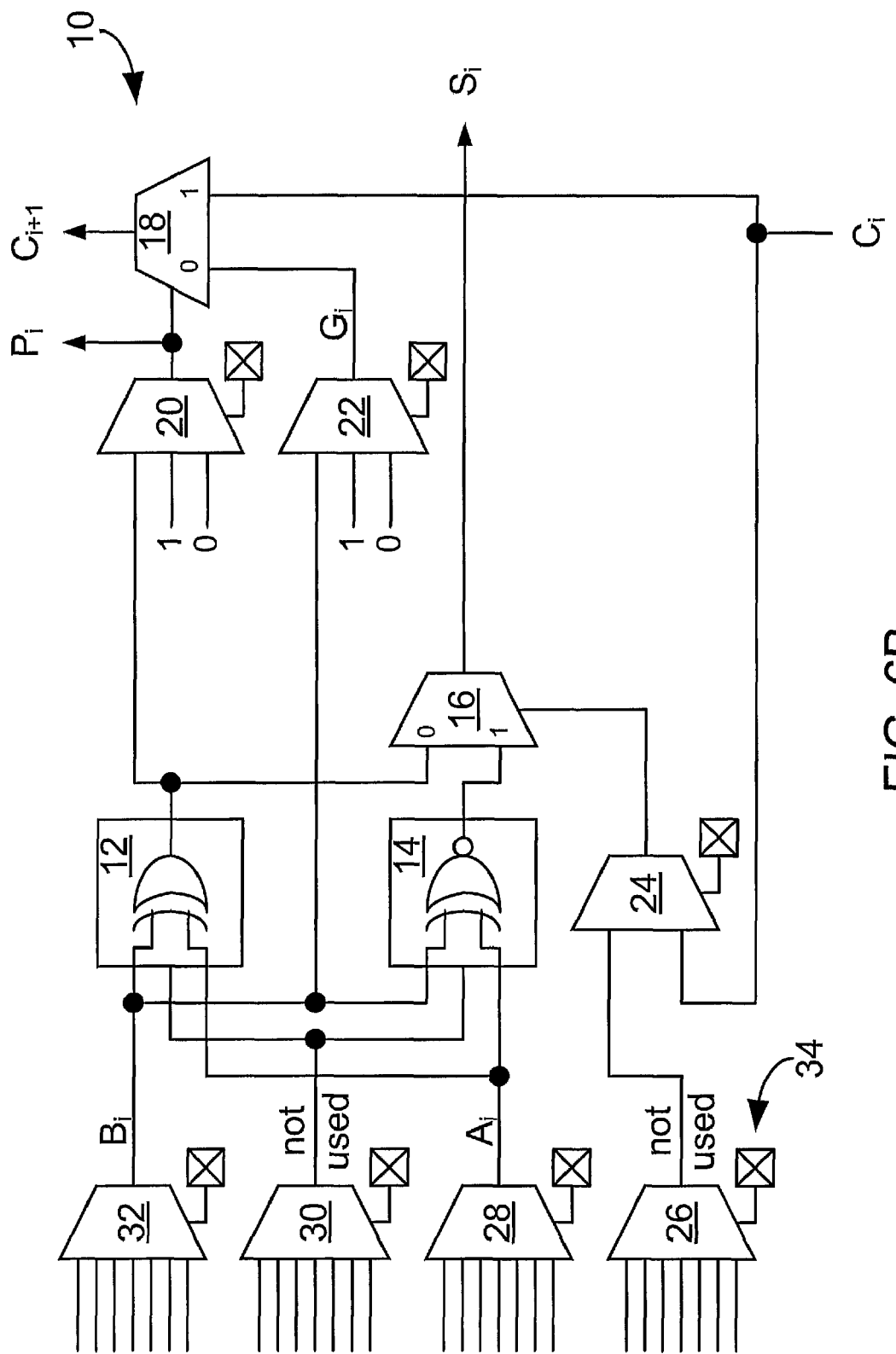
FIG. 6B shows an illustrative logic module employing the principles of the present invention.

Turning now to FIG. 6B, the same logic module 10 is shown with additional labels and details concerning how it is used in arithmetic mode. Multiplexers 28 and 32 programmed to gate the $A_i$ and $B_i$ signals to the function generator inputs respectively while the outputs of multiplexers 26 and 30 are ignored. Multiplexer 24 is programmed so that the carry in signal $C_i$ is presented to the select input of multiplexer 16. LUT3 block 12 is programmed to implement the two bit binary function $f_0=A_i$ XOR $B_1$, while LUT3 block 14 is programmed to implement the two bit binary function $f_1=A_i$ XNOR $B_1$. Because the functions f0 and f1 are binary complements of one another, multiplexer 16 performs an XOR function between the value on its select line and the value of $f_0$. Thus, $S_i=(C_i$ AND (NOT $f_0$)) OR ((NOT $C_i$) AND $f_0)=C_i$ XOR $f_0=C_i$ XOR $A_i$ XOR $B_i$ which is the correct logic function for the sum.

Figures 4A, 4B:
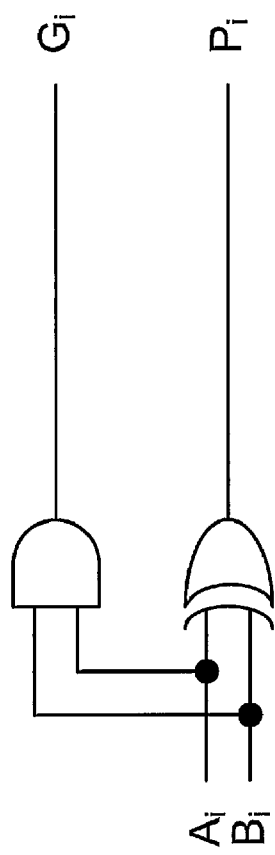
FIG. 4A shows the basic adder cell of a carry-look-ahead adder of the prior art.
FIG. 4B shows the Boolean truth table for the basic adder cell of FIG. 4B.
Figure 4C:
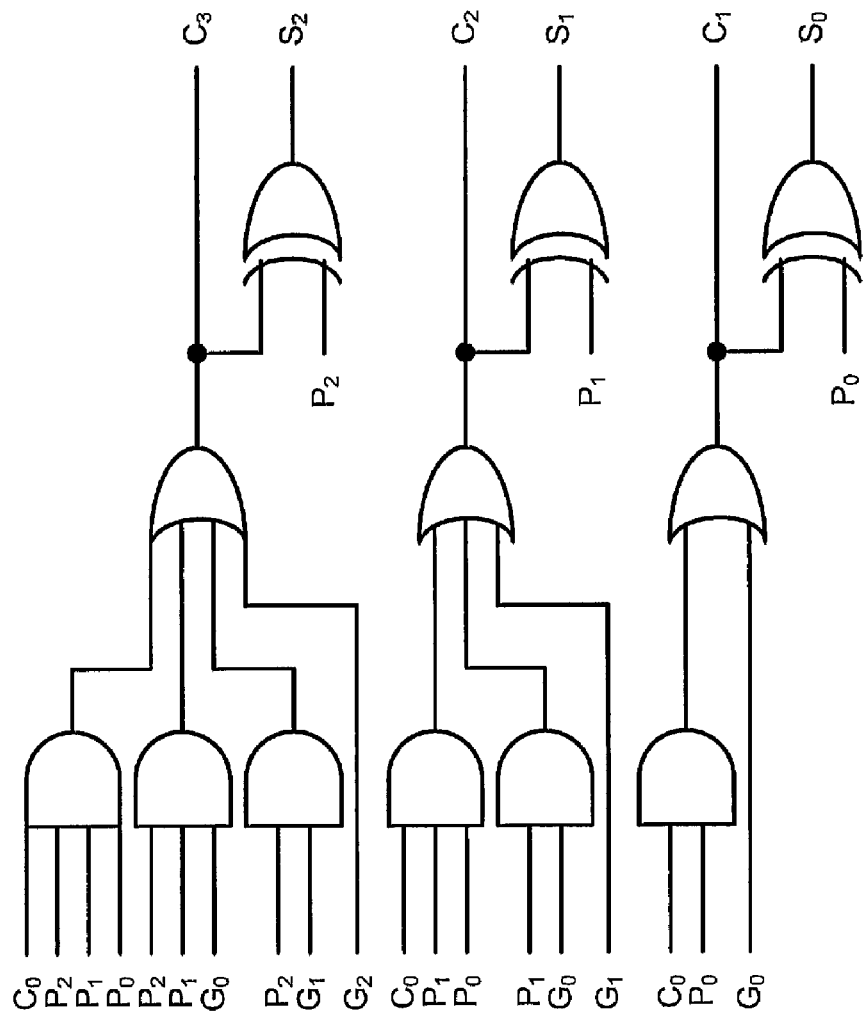
FIG. 4C shows a complete three-bit carry-look-ahead adder of the prior art.
Figure 4C:
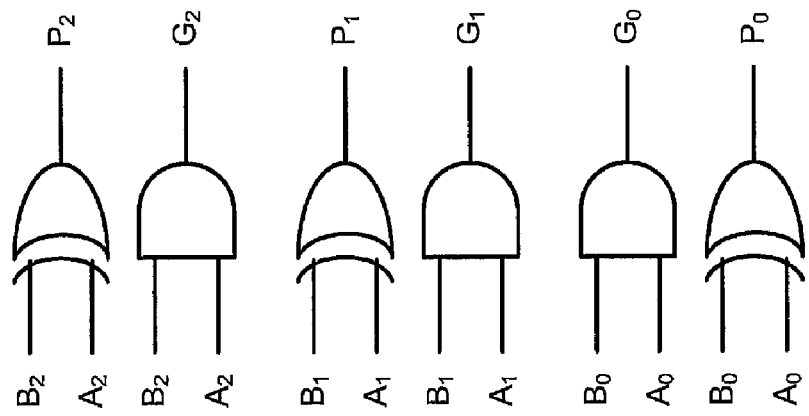
Figure 5:
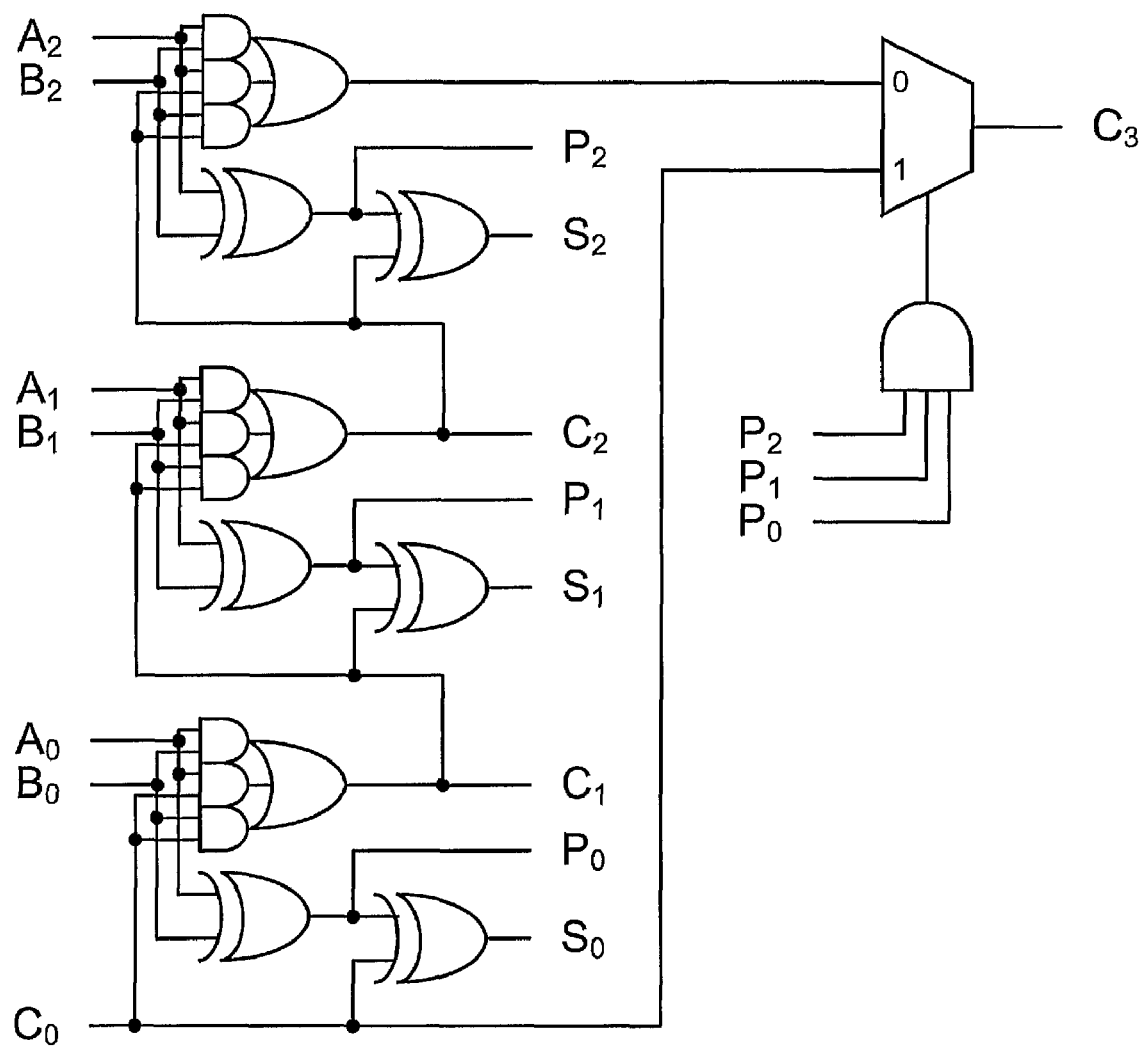
FIG. 5 shows a carry-skip adder of the prior art.

In arithmetic mode, the carry logic generates both a carry-propagate signal $P_i$ and a carry-generate signal $G_i$, though in a manner somewhat different than that shown in the carry-look-ahead adder of FIGS. 4A through 4C. Here multiplexer 20 is programmed to gate the output of LUT3 block 12 to the select input of multiplexer 18 since the function for the carry-propagate signal $P_i=A_i$ XOR $B_i$ is already available there. Thus when $P_i=1$ indicating that a carry signal will propagate through the adder to the next stage, the $C_i$ input signal is propagated from the channel-1 multiplexer data input of multiplexer 18 to the output node $C_{i+1}$. Note that the $P_i$ signal is brought out as a control output for use in adders with multiple bits.

Normally the carry-generate function logic is $G_i=A_i$ AND $B_i$. However, since the signal $P_i$ only allows the value of the signal at $G_i$ to be presented at the output of multiplexer 18 when $P_i=0$ (i.e., only when $A_i=B_i=0$ or $A_i=B_i=1$) then there is no need to generate the full $G_i$ function and sampling either $A_i$ or $B_i$ in place of a true $G_i$ signal will suffice. Thus multiplexer 22 is programmed to present the value of $B_i$ to the channel-0 data input of multiplexer 18.

Figure 7:
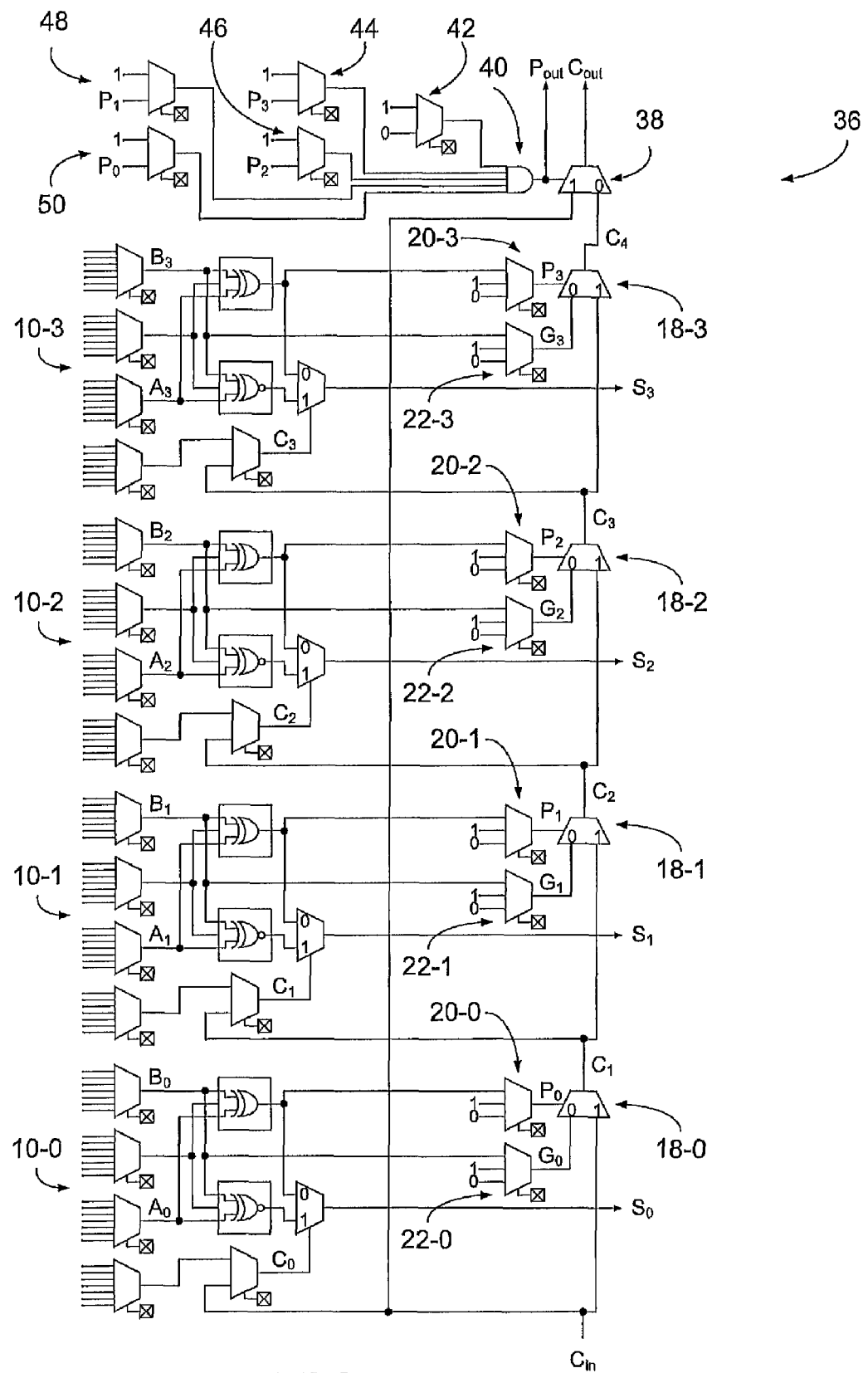
FIG. 7 shows an illustrative adder section employing the principles of the present invention.

Turning now to FIG. 7, an illustrative adder section built according to the principles of the present invention is generally indicated by reference number 36. The adder section 36 could be the arithmetic logic for an entire cluster if the cluster has only one section, or it could be a portion of the arithmetic logic for a cluster comprising a plurality of sections. Adder section 36 comprises four logic modules 10 of the sort shown in FIG. 6A and FIG. 6B identified as 10-0, 10-1, 10-2 and 10-3, a section carry input node $C_{in}$, a section carry output node $C_{out}$, and a section carry output circuit comprising multiplexer 38 and its control logic comprising AND-gate 40, and multiplexers 42, 44, 46, 48 and 50. Persons skilled in the art will realize that if the adder section were the only section in a cluster, then $C_{in}$ could be referred to as the cluster carry input node, $C_{out}$ could be referred to as the cluster carry output node, and multiplexer 38, AND-gate 40, and multiplexers 42, 44, 46, 48 and 50 could be referred to as the cluster carry output circuit. Such skilled persons will realize that there could be any number of logic modules 10 in the section and that the choice of four logic modules 10 is for purposes of illustration and not limiting in any way.

The four logic modules 10 are coupled together in a series carry arrangement between the section input node $C_{in}$ and the channel-0 data input of multiplexer 38. The section input node $C_{in}$ is also coupled to the logic function generator of the logic module 10-0 in the least significant bit position (associated with sum output $S_0$) and to the channel-1 data input of multiplexer 38. The output of AND-gate 40 is coupled to the cluster carry-propagate signal output node $P_{out}$ and the select input of multiplexer 38. The inputs of AND-gate 40 are coupled to outputs of multiplexers 42, 44, 46, 48 and 50. Multiplexer 42 has data inputs coupled to logic-1 and logic-0. Multiplexer 44 has data inputs coupled to logic-1 and the logic module 10-3 control output $P_3$. Multiplexer 46 has data inputs coupled to logic-1 and the logic module 10-2 control output $P_2$. Multiplexer 48 has data inputs coupled to logic-1 and the logic module 10-1 control output $P_1$. Multiplexer 50 has data inputs coupled to logic-1 and the logic module 10-0 control output $P_0$. The output of multiplexer 38 is coupled to the section carry output node $C_{out}$.

When the adder section is being used in arithmetic mode to implement an arithmetic logic circuit in the end user's design, multiplexer 42 is programmed to present a logic-1 at its output to one of the inputs of AND-gate 40 which enables the control logic in the section carry output circuit. Similarly, multiplexers 44, 46, 48 and 50 are programmed to gate the logic module 10-3, 10-2, 10-1 and 10-0 control signals $P_3$, $P_2$, $P_1$ and $P_0$ to their respective inputs of AND-gate 40. If all of the section carry-propagate signals $P_0$, $P_1$, $P_2$, and $P_3$ are equal to logic-1, then AND-gate 40 presents a logic-1 to the select input of multiplexer 38. This allows a carry signal to propagate from the section carry input node $C_{in}$ to the section carry output node $C_{out}$ directly through multiplexer 38 and completely bypassing the logic modules 10-0 through 10-3. The signal at $C_{in}$ will also propagate to multiplexer 38 by means of signals $C_1$, $C_2$, $C_3$, and $C_4$, but this will be much slower than passing through multiplexer 38 directly.

In arithmetic mode, if at least one of the section adder's carry-propagate signals are equal to logic-0, then AND-gate 40 presents a logic-0 to the select input of multiplexer 38. This will occur when the carry output signal $C_{out}$ is generated within the section and must make its way by means of as least one of the signals $C_1$, $C_2$, $C_3$, and $C_4$ through multiplexer 38 to the section carry output signal $C_{out}$.

Returning to FIG. 6B, multiplexers 20 and 22 are shown with their data inputs connected to logic-1 (shown as "1" in the diagram) and logic-0 (shown as "0" in the diagram. This allows the programming software to force logical values onto the $G_i$ and $P_i$ signals to enable controlling of the carry circuit for each logic module. For example, when the logic module is in logic mode it is often desirable to place the carry circuit in its lowest power state. Multiplexer 20 is programmed so that logic-0 is gated to the select input of multiplexer 18 which will then gate $G_i$ to the $C_{i+1}$ output. The logical value chosen for $G_i$ and programmed into the control elements controlling multiplexer 22 depends on the operating mode of the logic module coupled to the $C_{i+1}$ output. If the logic module coupled to the $C_{i+1}$ output is in logical mode then the value of $G_i$ is of no logical importance and will likely be chosen based upon the leakage characteristics of the transistors to minimize static power in the carry circuit or based on some other criteria beyond the scope of this disclosure.

If the logic module coupled to the $C_{i+1}$ output is the least significant bit of an adder in an arithmetic logic circuit in the end user's design with a static carry input signal (e.g., the value of $C_0$ never changes), the value of $G_i$ will be set to present either a logic-0 or a logic-1 to the $C_0$ input of that adder. Both situations are common. Often there is no carry input signal, for example, when two binary numbers are being added so $C_0$ would be set to logic-0 in that case. Another common situation is if the adder is being used, for example, as a two's compliment subtractor. In that case $C_0$ would be set to logic-1. If a dynamic carry input signal $C_0$ is required, then it must be supplied from the LUT4 input multiplexer 32. In this case, 22 is programmed to gate this signal to $G_i$. In this case, the $Z_{in}$ signal would most likely not be available for use by the function generator (unless, coincidentally, that particular signal is one of the four inputs for a desired logic function). Thus the place and route software would either have to not use the function generator at all, only place a three-input logic function there using LUT4 input multiplexers 26, 28, and 30 and the function generator to generate the function $F_{out}=f(W_{in}, X_{in}, Y_{in})$ while ignoring the $Z_{in}$ signal, or place a four-input logic function using Cin to generate the function $F_{out}=f(W_{in}, X_{in}, Y_{in}, Z_{in})=f(X_{in}, Y_{in}, C_0)$.

Returning to FIG. 7, the method for programming multiplexers 20 and 22 for each logic module 10 along with multiplexer 42 to control the carry logic for the entire section adder is shown. If the entire cluster is used for non-arithmetic logic, then the carry logic for each logic module 10 is disabled as described in conjunction with FIG. 6B. Additionally, multiplexer 42 is programmed such that logic-0 is gated to its associated input of AND-gate 40 and forces a logic-0 to be presented to the select input of multiplexer 38 which causes $C_4$ (also generated as described in conjunction with FIG. 6B) to be gated to the section output node $C_{out}$.

If the entire section is used as an adder or as part of a larger adder, then multiplexers 20-0, 20-1, 20-2 and 20-3 are programmed such that $P_i=A_i$ XOR $B_i$ for each stage, multiplexers 22-0, 22-1, 22-2 and 22-3 are programmed such that $G_i=B_i$ for each stage, and multiplexer 42 is programmed such that logic-1 is presented to one of the inputs of AND-gate 40.

In many cases, the number of bits in an adder is not evenly divisible by the number of bits supported by a single section or a single cluster. Unlike FPGA adders of the prior art, the adder section 36 illustrated in FIG. 7 is capable of starting the least significant bit of an adder at any location in the section. This ability to programmably place the least significant bit of an adder in any logic module in the adder section makes all of the logic modules in the section or cluster homogeneous with respect to arithmetic functions. This significantly simplifies development of the place and route software tool in the design software.

Carry chains run along rows or columns in an FPGA array and have a beginning at one edge of the array and an end at the other. Thus the maximum number of bits in a carry chain is limited by the number of clusters and sections and is thus limited by the size of the array. Depending on the size of the arithmetic logic function being implemented, not all logic modules will be candidates for the location of the least significant bit. For example, to place a 16 bit adder, there must be at least sixteen logic modules at the end of the carry chain, the least significant bit inclusive, in order to fit the adder into the carry chain. Thus the last fifteen logic modules in the chain would not be candidates for the least significant bit, though some of them would be candidates for use as the least significant bit of other arithmetic logic circuits with fewer bits. Similarly the very first logic module in a row or column may not be a candidate location for some or even all arithmetic logic circuits because the $C_{in}$ input is does not come from another logic module or cluster and thus may not be available for either dynamic or static carry input signals unless special circuitry is added outside the FPGA array to accommodate this.

In a first exemplary case for the illustrative adder section of FIG. 7, if the logic module designated 10-1 is to be the least significant adder bit, then multiplexer 42 is programmed to gate logic-0 to its input of AND-gate 40 while multiplexers 44, 46, 48, and 50 are programmed to gate logic-1 to their respective inputs of AND-gate 40. This presents a logic-0 at the select input of multiplexer 38 which disables the section carry-skip from section carry input node $C_{in}$ to carry section output node $C_{out}$ by means of multiplexer 38 and forces selection of the carry generated by the three least significant bits of the adder. Multiplexers 20-0 and 22-1 are programmed to gate the correct signals at nodes $G_0$ and $P_0$ so that a carry in of logic-1, logic-0, or a dynamic carry input signal is presented to the logic module 10-1 by means of the $C_1$ input as described in conjunction with FIG. 6B. Thus logic modules 10-1, 10-2, and 10-3 perform correctly as the three least significant bits of an adder. The logic module 10-0 is available for use in logic mode except for the limitations described in conjunction with FIG. 6B.

In a second exemplary case for the illustrative adder section of FIG. 7, if the logic module designated 10-2 is to be the least significant adder bit, then multiplexer 42 is programmed to gate logic-0 to its input of AND-gate 40 while multiplexers 44, 46, 48, and 50 are programmed to gate logic-1 to their respective inputs of AND-gate 40. This presents a logic-0 at the select input of multiplexer 38 which disables the section carry skip from section carry input node $C_{in}$ to carry section output node $C_{out}$ by means of multiplexer 38 and forces selection of the carry generated by the two least significant bits of the adder. Multiplexers 20-1 and 22-1 are programmed to gate the correct signals at nodes $G_1$ and $P_1$ so that a carry in of logic-1, logic-0, or a dynamic carry input signal is presented to the logic module 10-2 by means of the $C_2$ input as described in conjunction with FIG. 6B. Thus logic modules 10-2 and 10-3 perform correctly as the two least significant bits of an adder. The logic module 10-1 is available for use in logic mode except for the limitations described in conjunction with FIG. 6B while the logic module 10-0 is fully available for used in logic mode.

In a third exemplary case for the illustrative adder section of FIG. 7, if the logic module designated 10-3 is to be the least significant adder bit, then multiplexer 42 is programmed to gate logic-0 to its input of AND-gate 40 while multiplexers 44, 46, 48, and 50 are programmed to gate logic-1 to their respective inputs of AND-gate 40. This presents a logic-0 at the select input of multiplexer 38, which disables the section carry-skip from section carry input node $C_{in}$ to section carry output node $C_{out}$ by means of multiplexer 38 and forces selection of the carry generated by the least significant bit of the adder. Multiplexers 20-2 and 22-2 are programmed to gate the correct signals at nodes $G_1$ and $P_1$ so that a carry in of logic-1, logic-0, or a dynamic carry input signal is presented to the logic module 10-3 by means of the $C_3$ input as described in conjunction with FIG. 6B. Thus logic module 10-3 performs correctly as the least significant bit of an adder. The logic module 10-2 is available for use in logic mode except for the limitations described in conjunction with FIG. 6B while the logic modules 10-0 and 10-1 are fully available for used in logic mode.

Alternatively in the exemplary cases above for the illustrative adder section of FIG. 7, if there is a dynamic carry input, then the carry skip logic can be used. In the first exemplary case where logic module 10-1 is the least significant bit, multiplexers 42 and 50 are programmed to gate logic-1 to their respective inputs of AND-gate 40 while multiplexers 44, 46 and 48 are programmed to gate logic module 10-3, 10-2 and 10-1 control outputs $P_3$, $P_2$ and $P_1$ to their respective inputs of AND-gate 40. Multiplexers 20-0 and 22-0 are programmed to gate the correct signals at nodes $G_0$ and $P_0$ so that a dynamic carry input signal is presented to the logic module 10-1 by means of the $C_1$ input as described in conjunction with FIG. 6B. Since the bypassing of a signal from the section carry input node $C_{in}$ has been enabled, the dynamic carry input must also be gated to the section carry input node $C_{in}$ by setting the appropriate control elements in logic module 10-3 in the carry section with its section carry output node coupled to $C_{in}$. Thus logic modules 10-1, 10-2, and 10-3 perform correctly as the three least significant bits of an adder and the section control logic correctly performs the carry skip function for this first section of the adder.

Similarly, in the second exemplary case where logic module 10-2 is the least significant bit, multiplexers 42, 48 and 50 are programmed to gate logic-1 to their respective inputs of AND-gate 40 while multiplexers 44 and 46 are programmed to gate logic module 10-3 and 10-2 control outputs $P_3$ and $P_2$ to their respective inputs of AND-gate 40. Multiplexers 20-1 and 22-1 are programmed to gate the correct signals at nodes $G_1$ and $P_1$ so that a dynamic carry input signal is presented to the logic module 10-2 by means of the $C_2$ input as described in conjunction with FIG. 6B. Since the bypassing of a signal from the section carry input node $C_{in}$ has been enabled, the dynamic carry input must also be gated to the section carry input node $C_{in}$ by setting the appropriate control elements in logic module 10-3 in the carry section with its section carry output node coupled to $C_{in}$. Thus logic modules 10-2 and 10-3 perform correctly as the three least significant bits of an adder and the section control logic correctly performs the carry skip function for this first section of the adder.

Likewise in the third exemplary case where logic module 10-3 is the least significant bit, multiplexers 42, 46, 48 and 50 are programmed to gate logic-1 to their respective inputs of AND-gate 40 while multiplexer 44 is programmed to gate logic module 10-3 control output $P_3$ to their respective inputs of AND-gate 40. Multiplexers 20-2 and 22-2 are programmed to gate the correct signals at nodes $G_2$ and $P_2$ so that a dynamic carry input signal is presented to the logic module 10-3 by means of the $C_3$ input as described in conjunction with FIG. 6B. Since the bypassing of a signal from the section carry input node $C_{in}$ has been enabled, the dynamic carry input must also be gated to the section carry input node $C_{in}$ by setting the appropriate control elements in logic module 10-3 in the carry section with its section carry output node coupled to $C_{in}$. Thus logic module 10-3 performs correctly as the least significant bit of an adder and the section control logic correctly performs the carry skip function for this first section of the adder.

There are also aspects of the present invention regarding the most significant bit of an adder that the illustrative adder section of FIG. 7 is equipped to handle. In some arithmetic logic circuits, for example in two's compliment addition, the carry output of the most significant bit is not needed as part of the result of the operation. In other applications, for example in a magnitude comparison (e.g., a greater than or equal to operation) of unsigned binary numbers, the carry out of the most significant bit is needed as part of the result. If the carry out of the most significant bit is not needed, then multiplexers 20 and 22 in the logic module 10 corresponding the most significant bit will be programmed so that the $C_{i+1}$ signal will present either a logic-1 or a logic-0 on the $C_{i+1}$ signal. The logic module 10 coupled to the $C_{i+1}$ signal of the most significant bit can then either ignore its $C_i$ input and will be useable in logic mode or be used as the least significant bit of another arithmetic logic circuit with a static carry input signal.

If the carry out of the most significant bit is needed, then the logic module 10 which would have been the next significant bit in the arithmetic logic circuit is used to gate its carry input signal $C_i$ to the $F_{out}$ output for use in the end user's design. In this case, arithmetic logic circuits cannot be directly abutted along the carry chain and a single logic module 10 must be interposed between them to allow access to the carry of the most significant bit. However that interposed logic module 10 can be used to allow a dynamic carry input to enter the carry circuit of one arithmetic logic circuit by means of its multiplexers 20 and 22 while simultaneously allowing the carry of the other arithmetic logic circuit to exit. This need for a dynamic carry to enter or exit a carry chain also affects which logic modules are candidates for being the least significant bit of an arithmetic logic circuit placed near the edges of the FPGA array where the carry chain begins and ends. Thus, except for restrictions on the least significant bit candidate locations, arithmetic logic circuits can be placed at any arbitrary location in a sequence of adder sections 36 coupled together in a series carry arrangement with at most a single interposed logic module 10 between them. This allows the place and route software tool much greater flexibility than in clustered FPGA architectures of the prior art. It also potentially allows greater logic density for arithmetic logic circuits since there is no requirement to place the least significant bit at the beginning of a new section or new cluster.

Figure 8A:
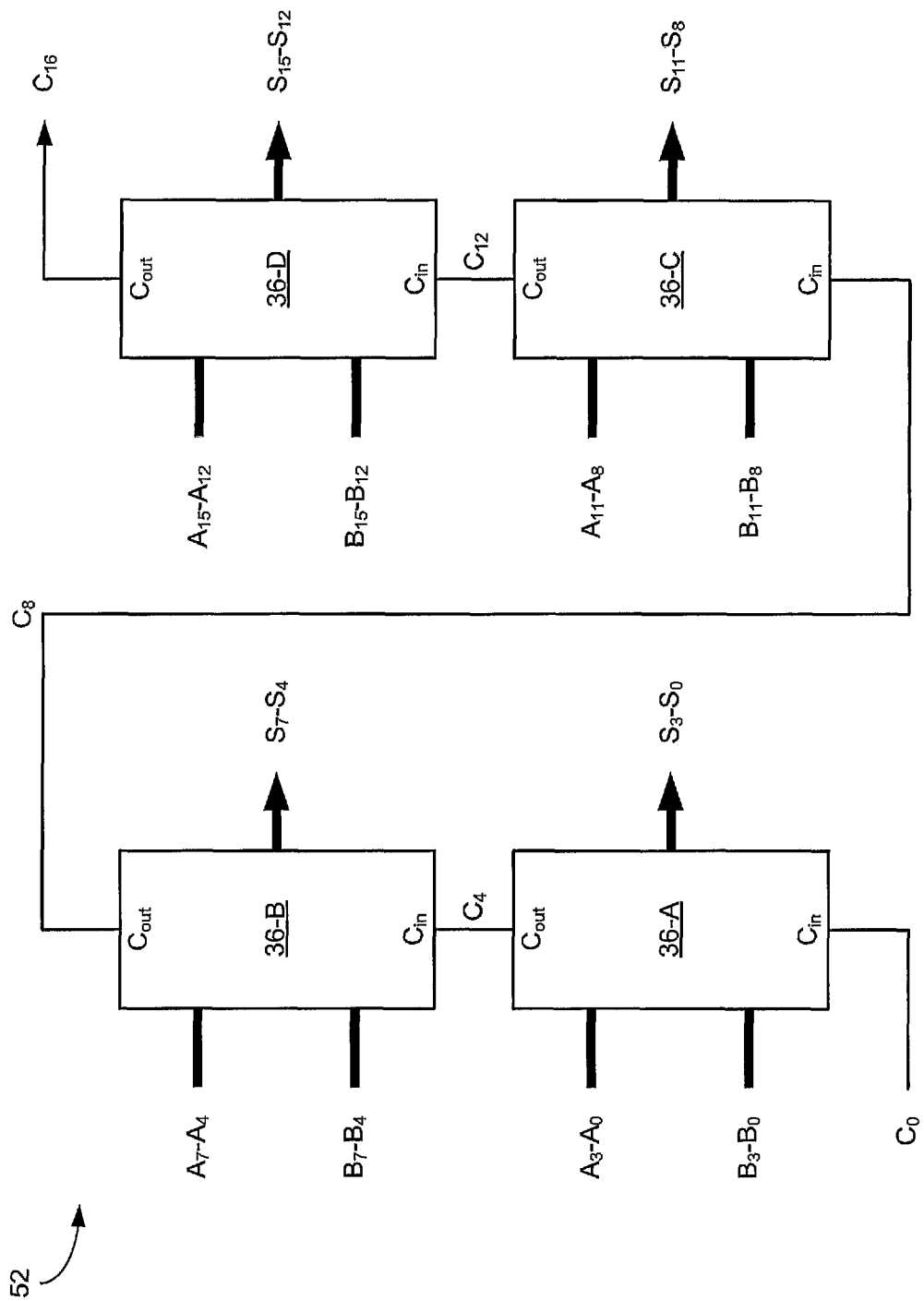
FIG. 8A shows an illustrative sixteen-bit adder occupying four four-bit adder sections employing the principles of the present invention.

Turning now to FIG. 8A, an illustrative adder 52 comprising multiple adder sections employing the principles of the present invention is shown. In the figure, four adder sections 36 labeled 36-A, 36-B, 36-C and 36-D are shown coupled together in a series carry arrangement between carry input node $C_0$ and carry output node $C_{16}$. As persons skilled in the art will readily recognize, the adder illustrated in FIG. 8A could comprise four separate clusters or multiple adder sections inside the same cluster. Such skilled persons will also appreciate that showing four adder sections is illustrative only and that other numbers of sections could be chosen to illustrate either a series of clusters or a number of sections inside the same cluster.

In FIG. 8A adder section 36-A is shown with its $C_{in}$ input coupled to signal $C_0$, its $A_i$ inputs coupled to signals $A_3$ through $A_0$, its $B_i$ inputs coupled to signals $B_3$ through $B_0$, its $S_i$ outputs coupled to signals $S_3$ through $S_0$ and its $C_{out}$ output coupled to signal $C_4$. Similarly, adder section 36-B is shown with its $C_{in}$ input coupled to signal $C_4$, its $A_i$ inputs coupled to signals $A_7$ through $A_4$, its $B_i$ inputs coupled to signals $B_7$ through $B_4$, its $S_i$ outputs coupled to signals $S_7$ through $S_4$ and its $C_{out}$ output coupled to signal $C_8$. Adder section 36-C is also shown with its $C_{in}$ input coupled to signal $C_8$, its $A_i$ inputs coupled to signals $A_{11}$ through $A_8$, its $B_i$ inputs coupled to signals $B_{11}$ through $B_8$, its $S_i$ outputs coupled to signals $S_{11}$ through $S_8$, and its $C_{out}$ output coupled to signal $C_{12}$. Lastly, adder section 36-D is shown with its $C_{in}$ input coupled to signal $C_{12}$, its $A_i$ inputs coupled to signals $A_{15}$ through $A_{12}$, its $B_i$ inputs coupled to signals $B_{15}$ through $B_{12}$, its $S_i$ outputs coupled to signals $S_{15}$ through $S_{12}$ and its $C_{out}$ output coupled to signal $C_{16}$.

Figure 8B:
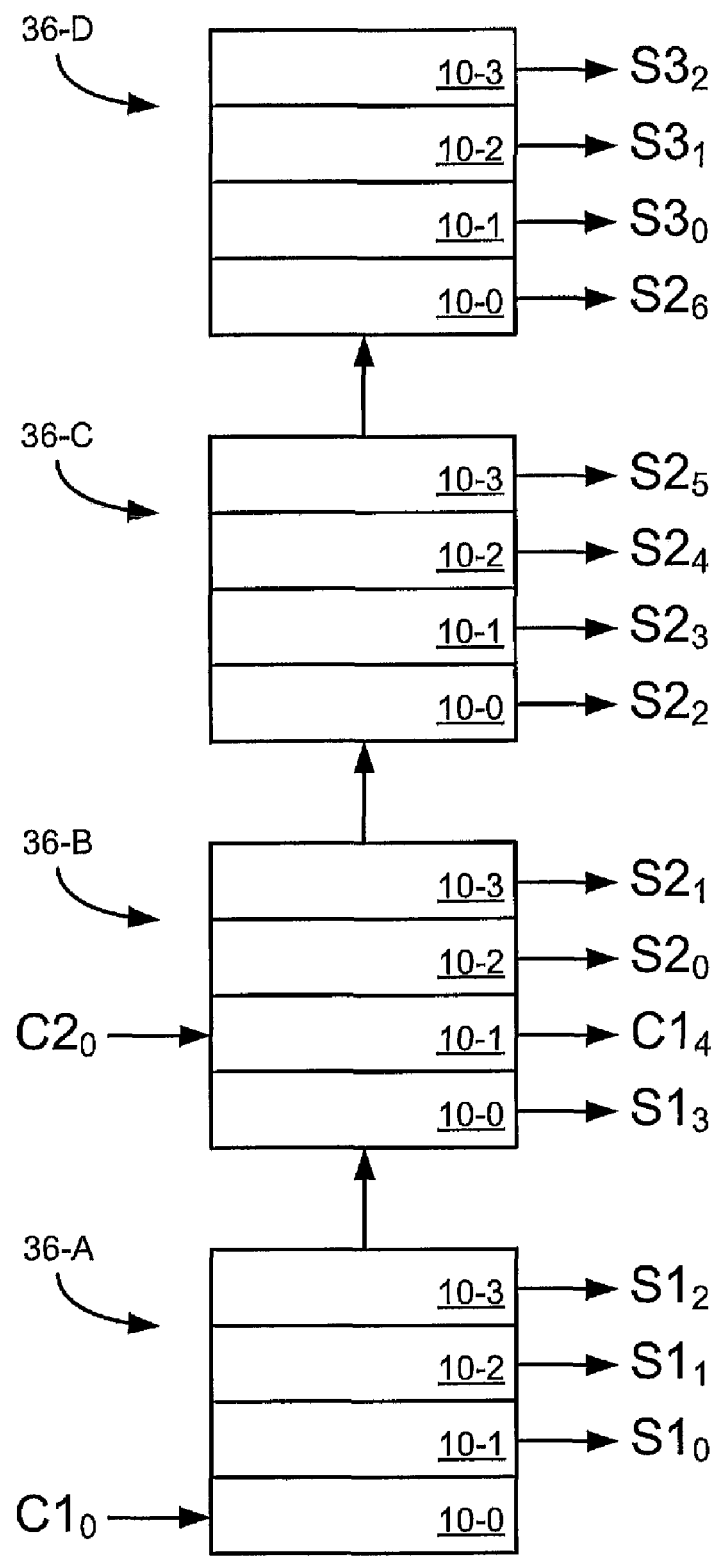
FIG. 8B shows three illustrative adders occupying four four-bit adder sections employing the principles of the present invention.

With the signal names shown in FIG. 8A, the four sections are shown configured as a single 16 bit adder with a dynamic carry in signal and a carry out signal, though persons skilled in the art will realize that many other configurations are possible. FIG. 8B illustrates one such alternate configuration. Three separate illustrative adders are shown, with their positions along the series carry arrangement identified by the module output nodes. The first illustrative adder is a four bit adder with its outputs labeled $S1_3$ through $S1_0$. Its most significant bit is placed in logic module 10-0 of adder section 36-B and its least significant bit placed in logic module 10-1 of adder section 36-A. The first illustrative adder has both a dynamic carry input $C1_0$ which enters the adder in logic module 10-0 of adder section 36-A and a dynamic carry output $C1_4$ which exits the adder in logic module 10-1 of adder section 36-B.

The second illustrative adder is a seven bit adder with its outputs labeled $S2_6$ through $S2_0$. Its most significant bit is placed in logic module 10-0 of adder section 36-D and its least significant bit placed in logic module 10-2 of adder section 36-B. The second illustrative adder has a dynamic carry input $C2_0$ which enters the adder in logic module 10-1 of adder section 36-B and no dynamic carry output.

The third illustrative adder is a three bit adder with its outputs labeled $S3_2$ through $S3_0$. Its most significant bit is placed in logic module 10-3 of adder section 36-D and its least significant bit placed in logic module 10-1 of adder section 36-D. The third illustrative adder has neither a dynamic carry input nor a dynamic carry output.

The necessary settings for the control elements in the various logic modules are made according to the principles described in conjunction with FIG. 6B and FIG. 7. Persons skilled in the art will realize that any number of combinations is possible due to the flexibility of the present invention and that this example is illustrative only.

Figure 9:
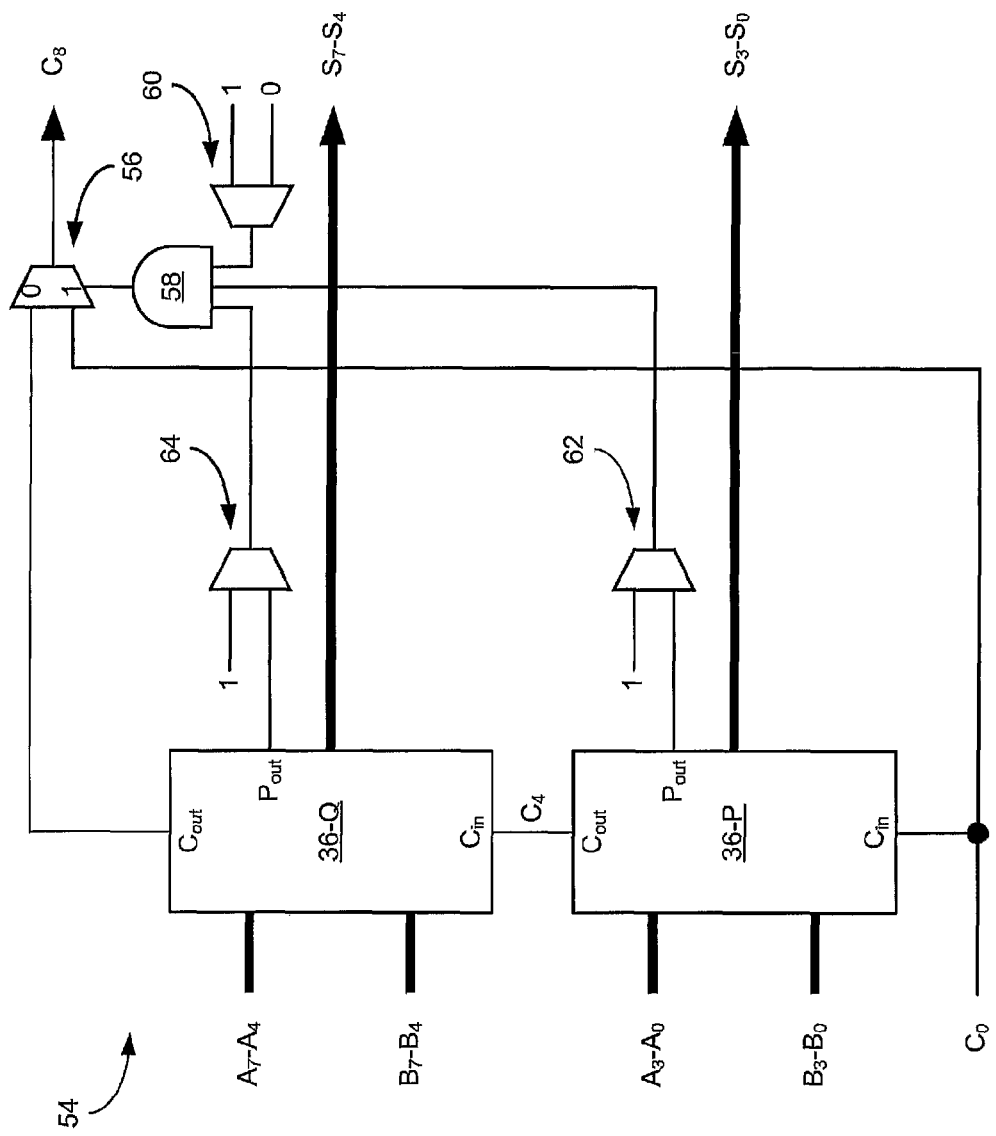
FIG. 9 shows an illustrative cluster adder employing the principles of the present invention.

Turning now to FIG. 9, an illustrative eight bit cluster adder generally indicated by reference number 54 employing the principles of the present invention is shown. Cluster adder 54 has two adder sections 36 of the type shown in FIG. 7 labeled 36-P and 36-Q. Persons skilled in the art will realize that the choice of two adder sections is illustrative only and that any plurality of adder sections is possible in FIG. 9. Such skilled persons will also realize that if only a single adder section were present in a cluster, then the section carry logic inside adder section 36 would make the additional cluster output circuitry shown in FIG. 9 redundant. In that case, the adder section 36 of FIG. 7 would be the entire cluster adder.

Also shown in FIG. 9 is a cluster carry output circuit comprising multiplexer 56 and its control logic comprising AND-gate 58, and multiplexers 60, 62 and 64. Adder sections 36-P and 36-Q are coupled in a series carry arrangement between cluster input node $C_0$ and the channel-0 data input of multiplexer 56. Cluster input node $C_0$ is also coupled to the channel-1 data input of multiplexer 56 and the $C_{in}$ input node of adder section 36-P. The $C_{out}$ output node of adder section 36-P is coupled to the $C_{in}$ input node of adder section 36-Q. The $C_{out}$ output node of adder section 36-Q is coupled to the channel-0 data input of multiplexer 56. AND-gate 58 has an output coupled to the select input of multiplexer 56 and three inputs coupled to the outputs of multiplexers 60, 62 and 64. The data inputs of multiplexer 60 are coupled to logic-0 and logic-1. The data inputs of multiplexer 62 are coupled to the $P_{out}$ output of adder section 36-P and logic-1. The data inputs of multiplexer 64 are coupled to the $P_{out}$ output of adder section 36-Q and logic-1.

The cluster carry output circuit of FIG. 9 is analogous to the adder section carry output circuit shown in FIG. 7 in that it allows a carry-skip to occur over some or all of the adder sections making up the entire cluster if the end user desires it. Furthermore, the cluster carry output circuit of FIG. 9 also supports the ability of the section adders 36-P and 36-Q to flexibly place adders inside cluster adder 54 with the least significant bits in any or all locations within the limitations discussed in conjunction with FIG. 6B and FIG. 7.

Static multiplexer 60 enables the carry-skip function when its output is logic-1 or disables it when its output is logic-0 in a manner analogous to multiplexer 42 in FIG. 7. Static multiplexers 62 and 64 allow the internal carry propagate logic of adder sections 36-P and 36-Q respectively to be ignored when logic-1 is gated to their outputs and to control multiplexer 56 when one or both of the $P_{out}$ outputs of adder sections 36-P and 36-Q are gated to their outputs. This is analogous to the way multiplexers 44, 46, 48 and 50 are used in FIG. 7.

For example, in a first an exemplary three bit adder with its least significant bit in logic module 10-1 of adder section 36-Q with a dynamic carry input signal, the dynamic carry input signal would enter the adder in logic module 10-0 of adder section 36-Q. Adder section 36-Q would be configured as described in the first exemplary case with the carry-skip enabled as described in conjunction with FIG. 7. Since adder section 36-P is not a part of the adder, static multiplexer 62 is programmed to gate logic-1 to its output node. Since the $P_{out}$ output of adder section 36-Q is an accurate representation of the state of the section carry output circuit control logic inside adder section 36-Q, multiplexer 64 is programmed to gate the $P_{out}$ output of adder section 36-Q to its output node.

In another example, an exemplary six bit adder with its least significant bit in logic module 10-2 of adder section 36-P with a dynamic carry input signal, the dynamic signal would enter the adder in logic module 10-1 of adder section 36-P. Adder section 36-P would be configured as described in the second exemplary case with the carry-skip enabled described in conjunction with FIG. 7 while adder section 36-Q is configured as a four bit adder with a dynamic carry in, also as described in conjunction with FIG. 7. Since the $P_{out}$ output of adder sections 36-P and 36-Q are both accurate representations of the state of the section carry output circuit control logic inside their respective adder section 36, multiplexers 62 and 64 are programmed to gate the $P_{out}$ outputs of adder sections 36-P and 36-Q to their respective output nodes.

Persons skilled in the art will recognize that many other adders can be implemented using the cluster adder shown in FIG. 9 and that the exemplary adders chosen are illustrative only and not limiting in any way.

FPGA manufacturers supply an elaborate software suite, often known as design software, to allow end users to make use of their FPGAs. The software is provided in a computer-readable medium such as one or more CD-ROMs, one or more DVD-ROMs, or by making it downloadable by means of the internet. The design software runs on a data processing system, sometimes known as a design system, which is typically a personal computer running either the Windows or Linux operating systems or a workstation running some variant of the UNIX operating system, though the use of other platforms is possible.

Design software allows for convenient programming of the FPGA. The design software typically has many different tools. Some of them provide means for entering the end user's complete design or parts thereof into the design system. For example, the user may enter schematics, describe the design in a hardware description language (HDL) such as Verilog or VHDL, or use some combination thereof. In complex designs, the end user starts out using small or basic design elements and combines them to create larger design elements of increasing complexity in a hierarchical manner until reaching the top level of the complete design. Arithmetic logic circuits are often entered specifically as design elements to insure they are correctly placed into logic modules and can make use of the carry circuits.

Tools are typically provided to allow the complete design or parts thereof to be logically simulated. After simulation, the parts of the design contained in a hardware description language are run through a synthesis tool to convert the HDL format into design elements for further processing. Finally the complete design is converted into a physical netlist. This step often includes properly identifying all of the arithmetic logic circuits not yet identified as requiring carry circuits so they can be correctly placed into logic modules and can make use of the carry circuits. Creating a physical netlist means creation of a data structure where the design elements are converted into an equivalent design consisting of nothing but function-type programmable elements that are physically available inside FPGA and the necessary connectivity information.

Another tool allows the physical netlist of the complete design to be placed and routed. "Placed" means that each of the function-type programmable elements is mapped to a specific physical instance of that function-type programmable element inside the FPGA. Examples of function-type programmable elements would be logic modules, input/output buffers, and SRAM blocks. "Routed" means the inputs and outputs of the function-type programmable elements are connected to each other by selecting routing-type programmable elements in the right physical locations to make the desired connections. Examples of interconnect-type programmable elements would be wires, switches, multiplexers, and buffers.

Once the place and route is done, other tools can be used to analyze the complete design. Such tools might include timing analysis, power analysis, noise analysis, and simulation based on the physical choices made by the place and route software. After performing the necessary analysis, if the end user is not satisfied that his complete design is correct, then he will need to change his design and then repeat the software flow until it is correct.

Once the design is correct, the process of actually programming the FPGA can begin. Another software tool analyzes the place and route data and determines the logical state of every control element inside FPGA and then creates the control data structure necessary to program it. Typically the control data structure is stored in some sort of non-volatile memory in the end user's system. A non-volatile memory is one that retains its stored data after its power supply is removed, disabled, or turned off. Examples of a non-volatile memory would be some sort of floating gate transistor based PROM like an EPROM, an EEPROM, or a flash memory chip, or a data file stored on a hard disk drive. For purposes of programming an FPGA built with a non-volatile control elements like antifuses or floating gate transistors, the control elements themselves can be the non-volatile memory that stores the control data structure.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A logic module for a field programmable gate array integrated circuit device including:
   a first input node;
   a second input node;
   a third input node;
   a fourth input node;
   an output node;
   a carry input node;
   a carry output node;
   a first LUT having a first data input coupled to the first input node, a second data input coupled to the second input node, and a third data input coupled to the third input node, the first LUT further having an output;
   a second LUT having a first data input coupled to the first input node, a second data input coupled to the second input node, and a third data input coupled to the third input node, the second LUT further having an output;
   a first multiplexer having a first data input coupled to the fourth input node, a second data input coupled to the carry input node, a select input, and a data output;
   a second multiplexer having a first data input coupled to the output of the first LUT, a second data input coupled to the output of the second LUT, a select input coupled to the output of the first multiplexer, and a data output coupled to the output node;
   a third multiplexer having a first data input coupled to the output of the first LUT, a second data input coupled to a high logic level, a third data input coupled to a low logic level, a set of select inputs, and a data output;
   a fourth multiplexer having a first data input coupled to the first input node, a second data input coupled to a high logic level, a third data input coupled to a low logic level, a set of select inputs, and a data output; and
   a fifth multiplexer having a first data input coupled to the carry input, a second data input coupled to the output of the fourth multiplexer, a select input coupled to the output of the third multiplexer, and a data output coupled to the carry output.

2. The logic module of claim 1, further including:
   a sixth multiplexer having a plurality of data inputs, a set of select inputs, and a data output coupled to the first input node;
   a seventh multiplexer having a plurality of data inputs, a set of select inputs, and a data output coupled to the second input node;
   a eighth multiplexer having a plurality of data inputs, a set of select inputs, and a data output coupled to the third input node; and
   a ninth multiplexer having a plurality of data inputs, a set of select inputs, and a data output coupled to the fourth input node.

3. The logic module of claim 1, wherein:
   the first LUT is programmed to function as an exclusive-OR gate;
   the second LUT is programmed to function as an exclusive OR gate; and
   the select input of the first multiplexer is set to a logic level that couples the carry input to its data output.

4. The logic module of claim 3, wherein the data output of the third multiplexer is coupled to a carry propagate node.

5. The logic module of claim 4 wherein:
   the first LUT is programmed to perform a first logic function;
   the second LUT is programmed t to perform a first logic function; and
   the select input of the first multiplexer is set to a logic level that couples the fourth input node to its data output.

6. The logic module of claim 5, further including:
   a sixth multiplexer having a plurality of data inputs, a set of select inputs, and a data output coupled to the first input node;
   a seventh multiplexer having a plurality of data inputs, a set of select inputs, and a data output coupled to the second input node;
   a eighth multiplexer having a plurality of data inputs, a set of select inputs, and a data output coupled to the third input node; and
   a ninth multiplexer having a plurality of data inputs, a set of select inputs, and a data output coupled to the fourth input node.

7. The logic module of claim 6 wherein:
   the set of select inputs of the third multiplexer are set to logic levels that couple a selected one of the high logic level and the low logic level to the data output of the third multiplexer; and
   the set of select inputs of the fourth multiplexer are set to logic levels that couple a selected one of the high logic level and the low logic level to the data output of the fourth multiplexer.

8. The logic module of claim 7 wherein the set of select inputs of the third multiplexer are set to logic levels that couple the low logic level to the data output of the third multiplexer.

* * * * *